US007952901B2

(12) United States Patent  
Chai et al.

(10) Patent No.: US 7,952,901 B2  
(45) Date of Patent: May 31, 2011

(54) CONTENT ADDRESSABLE MEMORY

(75) Inventors: Chiaming Chai, Chapel Hill, NC (US); David Paul Hoff, Raleigh, NC (US); Jason Philip Martzloff, Holly Springs, NC (US); Michael ThaiThanh Phan, Cary, NC (US); Manju Rathna Varma, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 121 days.

(21) Appl. No.: 11/836,405

(22) Filed: Aug. 9, 2007

(65) Prior Publication Data

US 2009/0040801 A1    Feb. 12, 2009

(51) Int. Cl.  
*G11C 15/00* (2006.01)

(52) U.S. Cl. .................... 365/49.1; 365/63; 365/189.07

(58) Field of Classification Search ................ 365/49.1, 365/49.11, 49.17, 226, 63, 189.07  
See application file for complete search history.

(56) References Cited

U.S. PATENT DOCUMENTS

| | | | |
|---|---|---|---|
| 5,155,700 A * | 10/1992 | Min et al. .................... | 365/63 |
| 5,662,772 A * | 9/1997 | Scheiter et al. .............. | 216/2 |
| 6,046,923 A | 4/2000 | Evans | |
| 6,137,707 A * | 10/2000 | Srinivasan et al. .......... | 365/49.15 |
| 6,208,545 B1 | 3/2001 | Leedy | |
| 6,249,450 B1 * | 6/2001 | Tanaka et al. ............... | 365/49.1 |
| 6,420,215 B1 | 7/2002 | Knall et al. | |
| 6,480,406 B1 | 11/2002 | Jin et al. | |
| 6,842,360 B1 | 1/2005 | Srinivasan | |
| 7,112,831 B2 * | 9/2006 | Kim et al. .................... | 257/202 |
| 7,126,837 B1 * | 10/2006 | Banachowicz et al. ...... | 365/63 |
| 7,177,183 B2 | 2/2007 | Scheuerlein et al. | |
| 7,304,874 B2 * | 12/2007 | Venkatraman et al. ...... | 365/49.1 |
| 2008/0273361 A1 * | 11/2008 | Dudeck et al. ............... | 365/49.1 |

FOREIGN PATENT DOCUMENTS

CN    1525549    9/2004

OTHER PUBLICATIONS

Okano H et al: "Design of Optically Coupled Three-Dimensional Content Addressable Memory" Extended Abstracts of the 22nd (1990 International) Conference on Solid State Devices and Materials Business Center for Acad. Soc. Japan Tokyo, Japan, 1990, pp. 765-768.  
Partial International Search Report—PCT/US07/085129, International Search Authority—European Patent Office—May 26, 2008.  
International Search Report—PCT/US07/085129, International Search Authority—European Patent Office—Nov. 20, 2008.  
Written Opinion—PCT/US07/085129, Internatioanl Search Authority—European Patent Office—Nov. 20, 2008.

* cited by examiner

*Primary Examiner* — Pho M Luu  
*Assistant Examiner* — Tha-O Bui  
(74) *Attorney, Agent, or Firm* — Nicholas J. Pauley; Jonathan T. Velasco; Tim Loomis

(57) ABSTRACT

A content addressable memory (CAM) is disclosed. The CAM has first and second CAM cells in which each adjacent CAM cell is rotated 180° relative to its neighbor, which provides a compact physical arrangement having overall matched CAM array cell and RAM array cell row heights. Further, an interleaved set scheme can be applied to the CAM cells to provide reduced routing of compare signals and reduced parasitic capacitance.

34 Claims, 10 Drawing Sheets

Conventional Art

CONTENT ADDRESSABLE MEMORY

FIELD OF DISCLOSURE

The present disclosure relates generally to memory architecture, and more specifically, to methods and systems for content addressable memory (CAM).

BACKGROUND

CAMs can include conventional semiconductor memory (e.g., static random access memory (SRAM)) and comparison circuitry that enables a search operation to be completed rapidly (e.g., in a single clock cycle). This ability allows hardware implementation of search algorithms, which provide greater speed than software implemented searches. In a physical design of a CAM array structure, it is desirable to have a regular shape, such as a rectangle, in order to reduce the size of the CAM array structure and make efficient use of space. Speed and power consumption are issues in high performance designs that are addressed by avoiding unnecessary parasitic capacitance. A physical layout that reduces critical area and routing reduces parasitic capacitance. However, certain aspects of CAM designs make achieving maximum efficiency in their physical design challenging.

Figure 1:
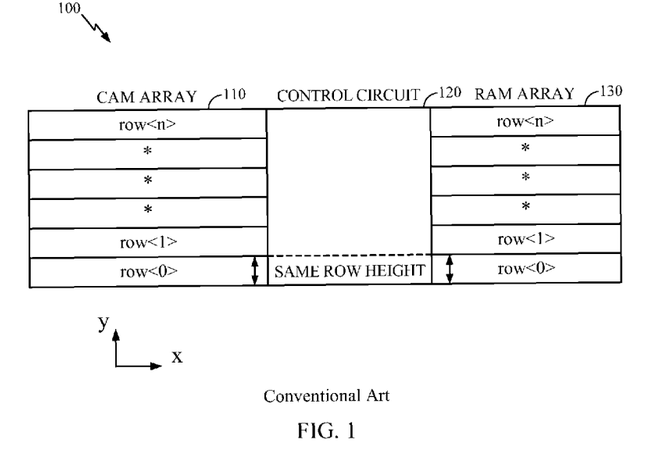
FIG. 1 is a conceptual top level cache block diagram illustrating a CAM and RAM array.

FIG. 1 is a conceptual top level cache block diagram 100 of CAM 110 and RAM 130 arrays having rows <0>, <1>, . . . <n>. The CAM 110 and RAM 130 are separated by control circuit 120. As shown in FIG. 1, the CAM array 110 and the RAM array 130 each have the same number of rows. To produce an efficient design, it is desirable to match the CAM array 110 row height to the RAM array 130 row height, as shown in FIG. 1, so that the overall shape of the CAM array has a rectangular shape, when viewed in the x and y plane (i.e., the footprint of the RAM array), thereby making efficient use of the area used. For purposes of this disclosure, the "row height" refers to the distance in the y-direction, as shown, for example, in FIG. 1.

Figure 2A:
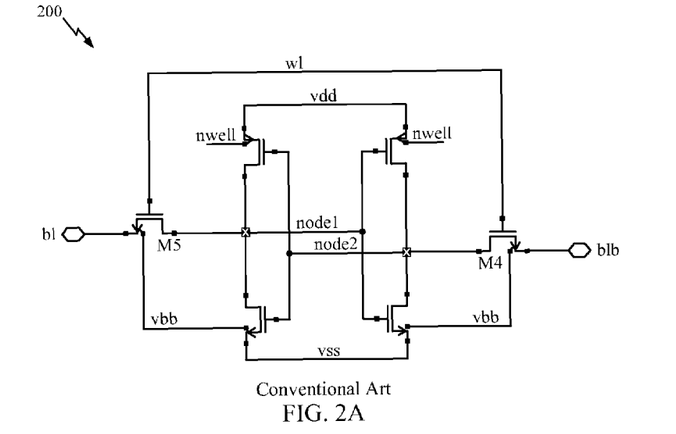
FIG. 2A is a schematic illustrating a RAM array cell.
Figure 2B:
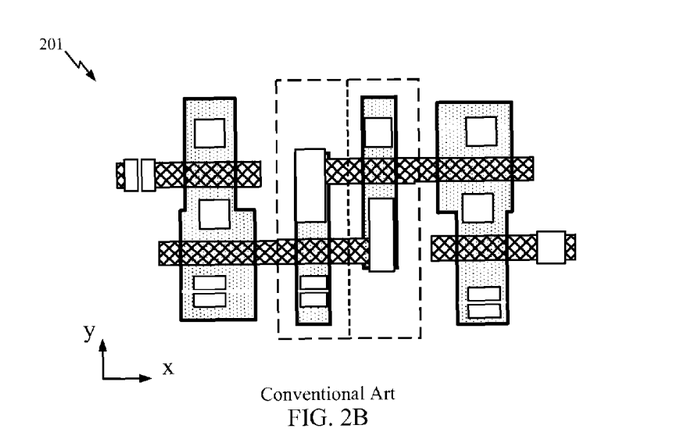
FIG. 2B is a RAM array cell layout.

In a static random access memory (SRAM) design, a 6-T storage cell often defines the minimum possible row height of the array structure. This RAM cell is given special ground rule waivers from a foundry so that process technologies can be pushed to the limit to produce a minimum area cell. FIG. 2A is a schematic of a conventional RAM array cell 200 which is composed of a 6-T storage cell. FIG. 2B shows a RAM array cell layout. Generally, the RAM cell 201 is provided by the foundry. Significant design effort is applied to reduce the physical size of the RAM cell and thereby make efficient use of the area used per cell, as shown in FIGS. 1 and 2B. Further, when designing the CAM array 110, the area on the CAM side (i.e., CAM array 110 in FIG. 1) should also be reduced because it is desirable to obtain a one-to-one correspondence between the height of the CAM array 110 side and the RAM array 130 side.

With reference again to FIG. 1, a content addressable memory (CAM) array 110 typically includes a storage cell, such as the 6-T RAM cell 201, and compare circuitry for each bit in the array. To produce an efficient design, it is desirable to at least substantially match the CAM array 110 row height to the RAM array 130 row height such that there is generally a one-to-one correspondence of the CAM array 110 and the RAM array 130.

For example, one way to match the CAM array 110 row height to the RAM array 130 row height is to limit the height of the CAM cells to the height of the RAM cell 201 which is included therein. Accordingly, there is a one-to-one correspondence in height between the height of each row of the CAM array 110 and each row of the RAM array 130, as shown in FIG. 1.

Figure 3:
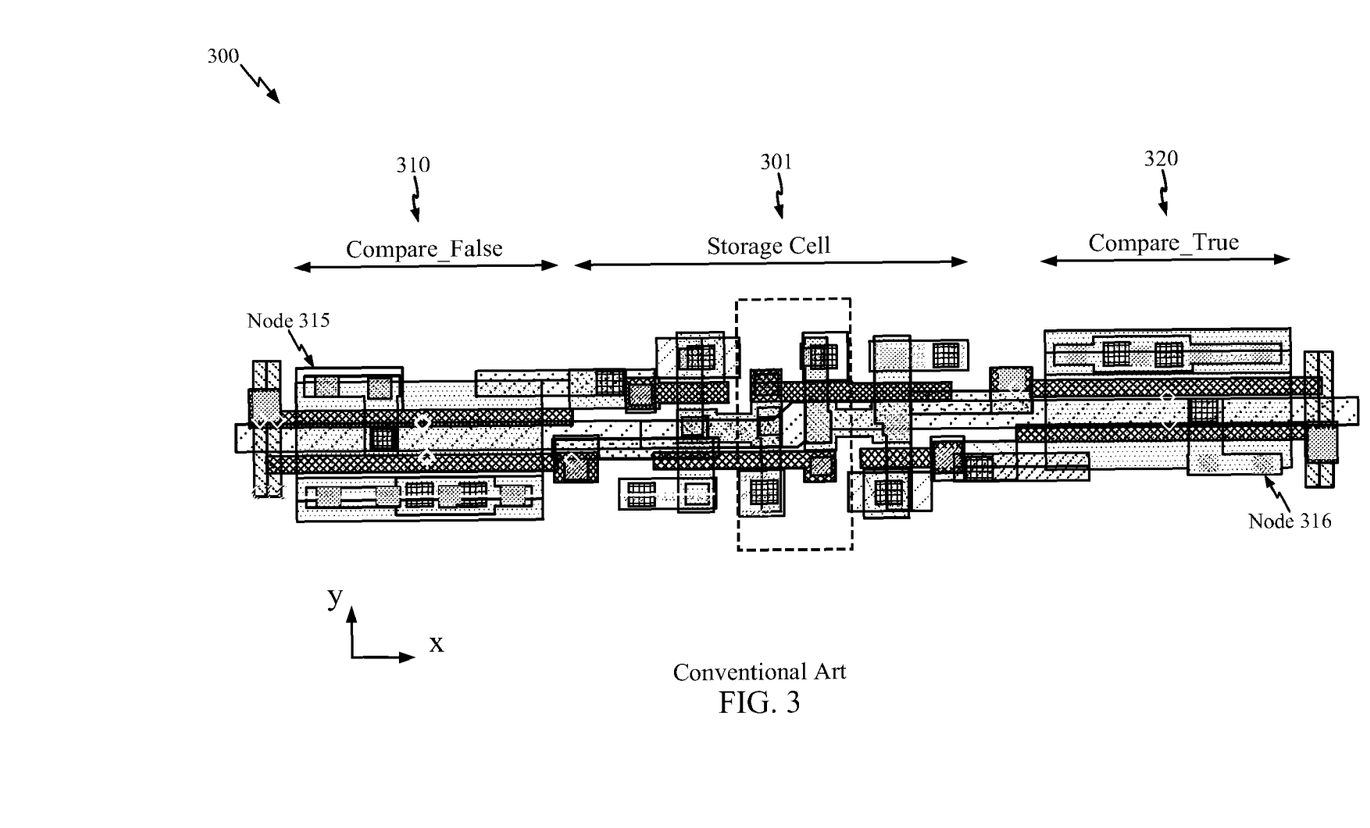
FIG. 3 is an illustration of a non-interleaved set CAM array cell layout.

FIG. 3 shows one conventional way of implementing a matched row height cache design. Particularly, FIG. 3 shows a non-interleaved set CAM array cell layout 300 in which the height of the compare stacks 310 and 320 matches the height of the storage cell (i.e., RAM array cell 301). In the conventional designs, to maintain the common height, the nodes 315 and 316, which can be coupled to a matchline, are split up on either side of the cell, which results in additional capacitance.

In FIG. 3, the storage cell, i.e., RAM array cell 301, is laid out such that two compare stacks 310 (false/compliment) and 320 (true), are on each side of the RAM array cell 301. The row height of each of the compare stacks 310 and 320 is designed to be no larger than the row height of the RAM array cell 301. The nodes 315 and 316 can be connected by a net. For purposes of this disclosure, a net is a wire connecting two or more nodes (two or more points). When rows are stacked sequentially, as in FIG. 3, and compare lines are vertically aligned, significant capacitance is added to the nodes 315, 316. The matchline nets are connected across each bit within a row, but may be unique from row to row, as illustrated in FIG. 4.

Figure 4:
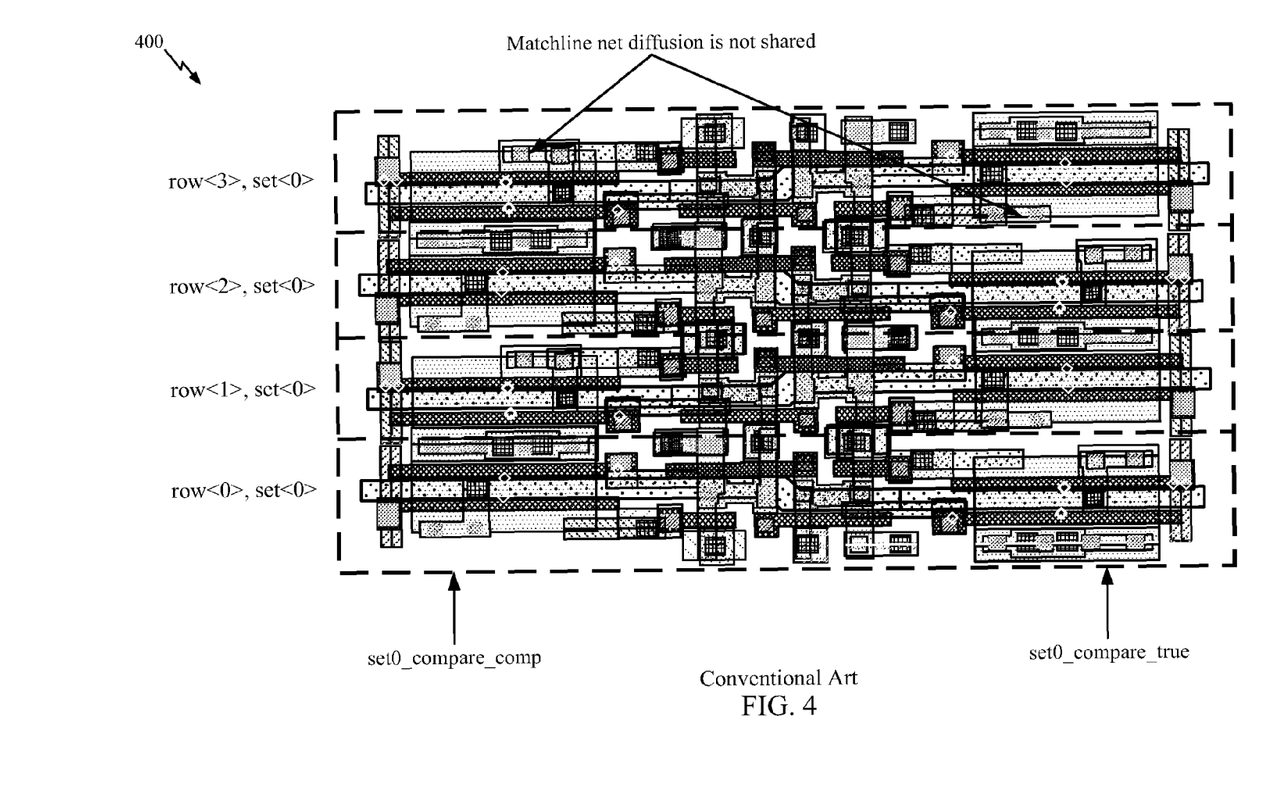
FIG. 4 is an illustration of a non-interleaved set scheme CAM design.

FIG. 4 is an illustration of a conventional CAM design 400 in which rows within an array are placed consecutively. Each CAM array cell is identified by dashed lines. In FIG. 4, the compare lines are vertically aligned. However, in FIG. 4, the compare transistor stacks each have their own matchline, which results in increased capacitance. That is, in FIG. 4, the matchlines do not share diffusion.

As described above, the conventional CAM array designs, for example, as shown in FIGS. 3 and 4, result in increased capacitance which degrades the performance of the memory array. Thus, there is a need for a CAM array design that makes efficient use of space, reduces critical area and routing, and reduces parasitic capacitance.

SUMMARY

Exemplary embodiments of the invention are directed to systems and methods for Content Addressable Memory (CAM).

For example, an exemplary embodiment is directed to Content Adressable Memory (CAM) including a first CAM cell having a first storage circuit and a first compare circuit, and a second CAM cell having a second storage circuit and a second compare circuit. The first CAM cell and the second CAM cell are positioned into a substantially rectangular area. The first and second storage circuits are vertically stacked. The first and second compare circuits are each positioned at respective outer edges of the rectangle.

Another exemplary embodiment is directed to a processor having a Content Addressable Memory (CAM) array including a plurality of CAM cell units. Each CAM cell unit includes a first CAM cell having a first storage circuit and a first compare circuit, and a second CAM cell having a second storage circuit and a second compare circuit. Each CAM cell is configured in an L-shape and the first and second CAM cells are arranged in an interlocking configuration to form a substantially rectangular shape.

Another exemplary embodiment is directed to a method for producing a Content Addressable Memory (CAM), including forming an L-shaped first CAM cell having a first storage circuit and a first compare circuit, forming an L-shaped second CAM cell having a second storage circuit and a second compare circuit, and arranging the first and second CAM cells in an interlocking configuration to form a substantially rectangular shape.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Embodiments of the invention relate generally to content addressable memory (CAM) structures, and more specifically, to methods and systems for providing content addressable memory (CAM) having a plurality of CAM cells (e.g., first and second CAM cells) arranged to reduce the area used and routing complexity, thereby reducing parasitic capacitance.

In one embodiment, matched CAM and RAM row heights are created by rotating alternate CAM rows 180° relative to neighboring CAM rows, as shown, for example, in FIGS. 5 and 6, which will be described below in greater detail. It is desirable to avoid adding complicated routing requirements and significant capacitance that degrade design performance. Thus, another exemplary embodiment will be described which applies an interleaved set scheme to provide a compacted physical placement with matched CAM and RAM row heights. According to an aspect of this embodiment, the net capacitance is reduced through diffusion sharing while maintaining regular minimal signal routing. The exemplary embodiments reduce area, power consumption, and increase maximum operating speed of the CAM design. Another aspect of this embodiment is that it does not require a new decoding scheme. A direct mapped decoder is used by switching the input address bus order. Exemplary aspects of this embodiment will be described below with reference, for example, to FIGS. 7-10.

Figure 5A:
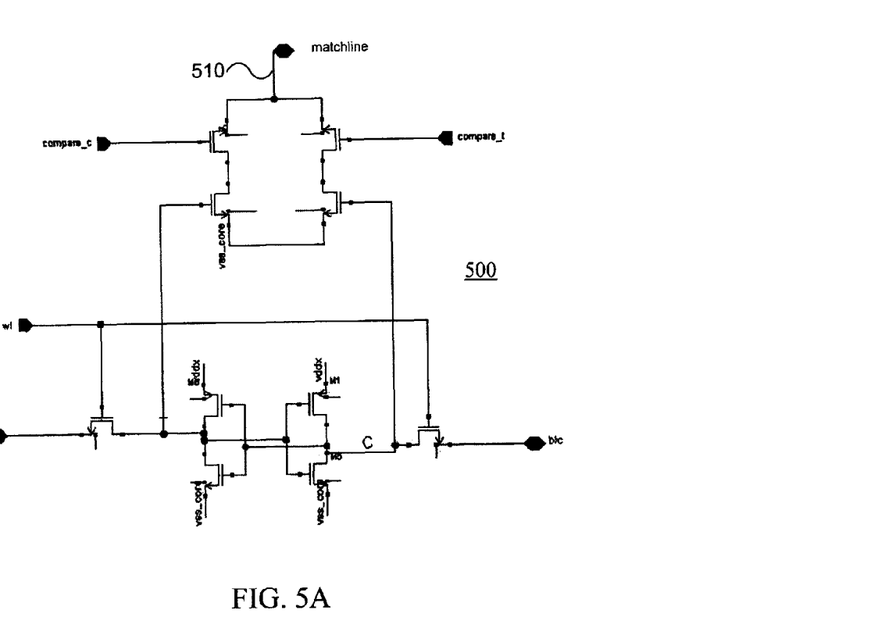
FIG. 5A is a schematic illustrating a CAM array cell.

In one embodiment, the CAM array includes a 6-T storage cell 502, which is similar to the 6T storage cell illustrated in FIG. 2, and compare circuitry 505 for each bit in the array, as shown in FIG. 5A. Regarding CAM array cell 500 performance, the node labeled matchline 510, in FIG. 5A, is one node that determines the CAM search performance. Therefore, it is desirable to reduce the capacitance on the matchline node 510. Accordingly in at least one embodiment, the diffusion region of the transistor associated with compare complement/false (compare_c) is shared with diffusion region of the transistor associated with compare true (compare_t) such that the capacitance on the matchline node is reduced. Accordingly, by diffusion sharing and reducing the capacitance of the matchline, embodiments can reduce the power and increase the performance of the CAM array cell 500.

Figure 5B:
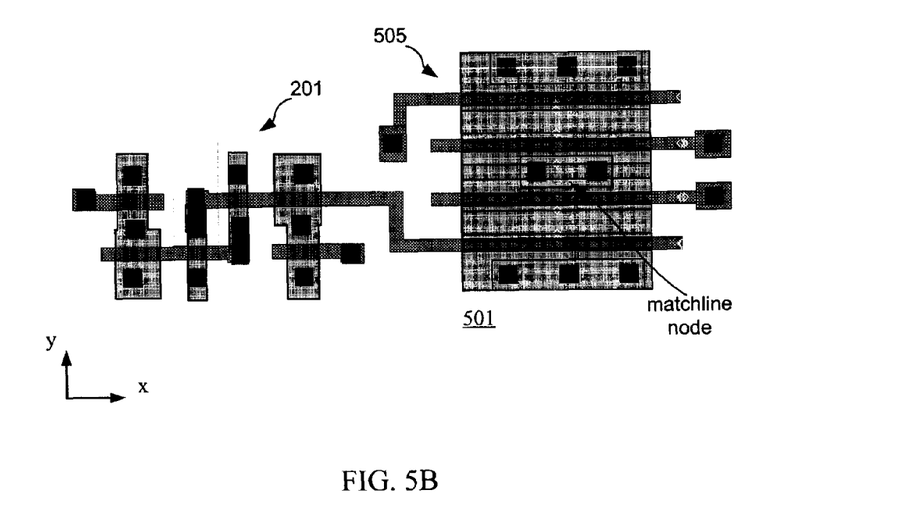
FIG. 5B is a CAM array cell layout.

FIG. 5B is an illustration of a CAM array cell layout 501, according to at least one embodiment of the invention. Corresponding references, such as the matchline node 510, true T, complement C, compare true (compare_t), compare complement/false (compare_c), and Vss (vss_core), are provided for correlation to the schematic diagram of FIG. 5A. As illustrated in FIG. 5B, the layout of the CAM array cell 501 provides greater diffusion sharing by providing adjacent compare circuitry 505 to reduce matchline capacitance by sharing a common matchline node 510 and diffusion regions of the adjacent transistors, as discussed in relation to FIG. 5A. Further, embodiments provide an 'L' shaped cell (as indicated by the dashed lines) which has a greater y dimension than a conventional RAM array cell. That is, the height in the y-direction of the compare stack 505, as illustrated in FIG. 5B, is greater than the height in the y direction of a conventional RAM array cell (see, e.g., FIG. 2B) or CAM cell (see, e.g., FIG. 3).

Figure 6:
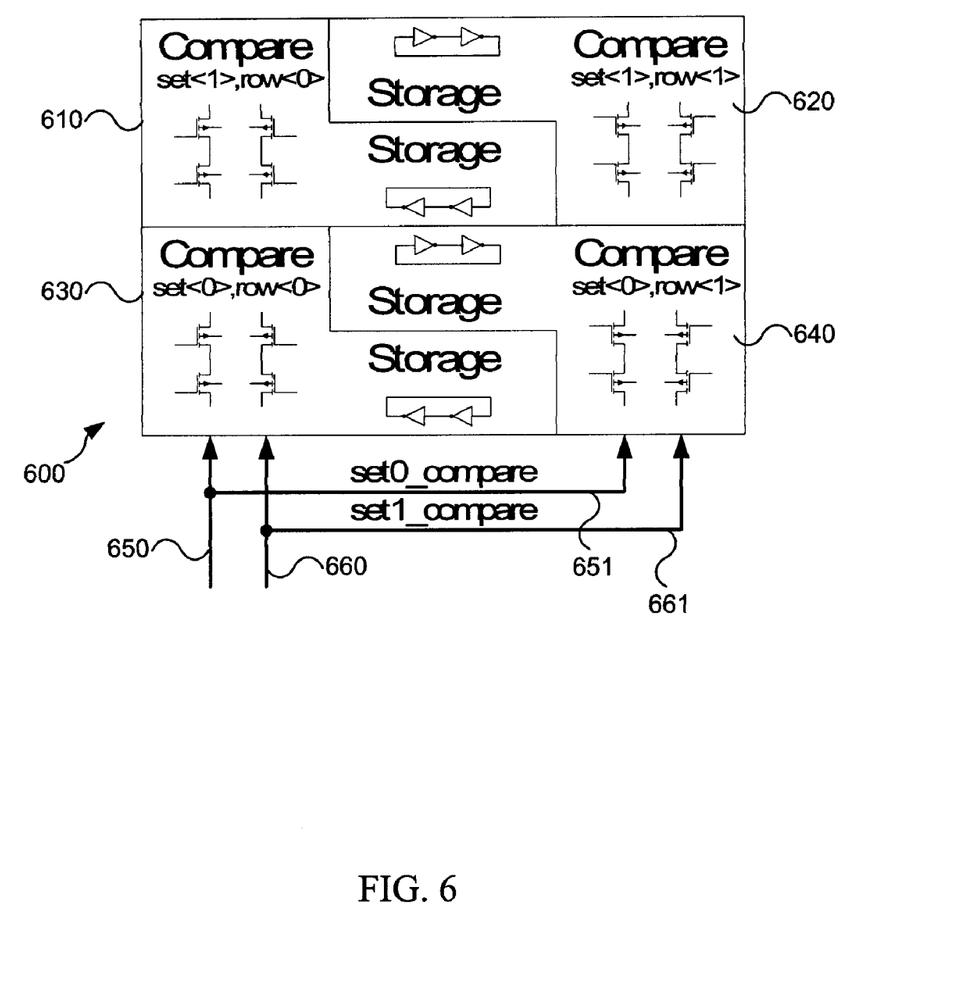
FIG. 6 is a block diagram illustrating a non-interleaved set scheme CAM array.

With reference to FIG. 6, an embodiment of the invention can include a non-interleaved set scheme CAM array arranged in an interlocking 'L' shape to allow for minimum area while providing the reduced matchline capacitance of the embodiment of FIG. 5B. FIG. 6 shows a CAM array 600 having CAM array cells 610, 620, 630, and 640, each including a compare circuit and storage circuit (i.e., a RAM cell). As mentioned above, the layout of the CAM array cell is arranged to provide an 'L' shaped cell which is taller than conventional RAM cells, but still allows for a reduced area of the memory array 600. Accordingly, each adjacent CAM array cell is rotated 180° relative to its neighbor to form the interlocking 'L' shapes illustrated in FIG. 6.

For example, CAM array cell 620 is rotated 180° relative to the CAM array cell 610, and the CAM array cell 640 is rotated 180° relative to the CAM array cell 630. Each interlocking 'L' group provides for two storage cells and two compare circuits. The exemplary embodiment of FIG. 6 provides a compact design in which each unit of adjacent CAM array cells (e.g., 610 and 620, 630 and 640, etc.) forms a rectangular shape having a height that is substantially equal to twice the height of a conventional RAM array cell. Thus, the configuration of FIG. 6 provides a design that has an overall one-to-one correspondence of RAM cell to compare cell, while providing reduced matchline capacitance.

For purposes of this disclosure, stacking rotated rows sequentially within a set means that the compare inputs of every other row will be in a separate vertical column. The extra column of inputs results in two routing tracks per compare signal (e.g., set_compare signal), as shown in FIG. 6. That is, if rotated rows are placed in sequential order within a set, there will be two routing tracks for each set compare input (e.g., set0_compare input 650 and 651, and set1_compare input 660 and 661); one for each vertical column. The extra column of inputs (e.g., 651 and 661) results in additional routing requirements.

Figure 7A:
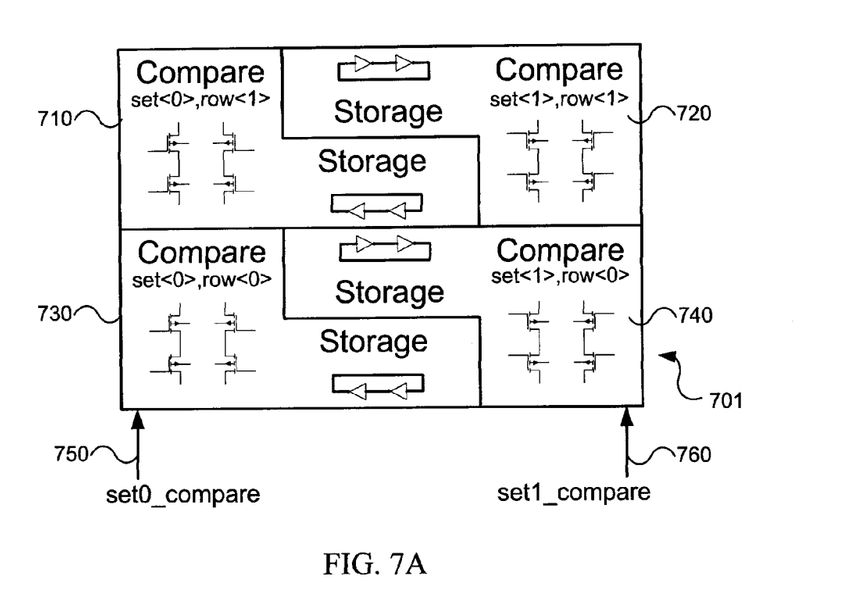
FIGS. 7A is a block diagram illustrating an interleaved CAM structure.

To reduce the routing requirements and associated parasitic capacitance with the extra lines, an interleaved set scheme can be used according to embodiments of the invention. For example, as illustrated in FIG. 7A, an interleaved design also has an overall one-to-one correspondence between CAM and RAM row heights, while reducing routing and parasitic capacitance. Net capacitance is reduced through diffusion sharing while limiting or maintaining signal routing (e.g., regular minimal signal routing). The exemplary embodiments reduce area, power consumption, and increase maximum operating speed of the CAM array. Also, at least one exemplary embodiment is implemented without requiring a new decoding scheme. In one embodiment, a direct mapped decoder can be utilized by rearranging the input address bus order.

An interleaved set CAM, in one embodiment, uses a set associative array design. Instead of vertically placing sequential rows within a set, as illustrated in FIG. 6, the rows from two vertically adjacent sets are physically interleaved and the CAM array cells are rotated 180° relative to their neighbors. The interleaved pairs of sets are stacked vertically to populate each CAM bank. In at least one embodiment, set specific control signals within the CAM bank are in vertical alignment, such as exemplarily illustrated in FIGS. 7A and 7B.

Figure 8:
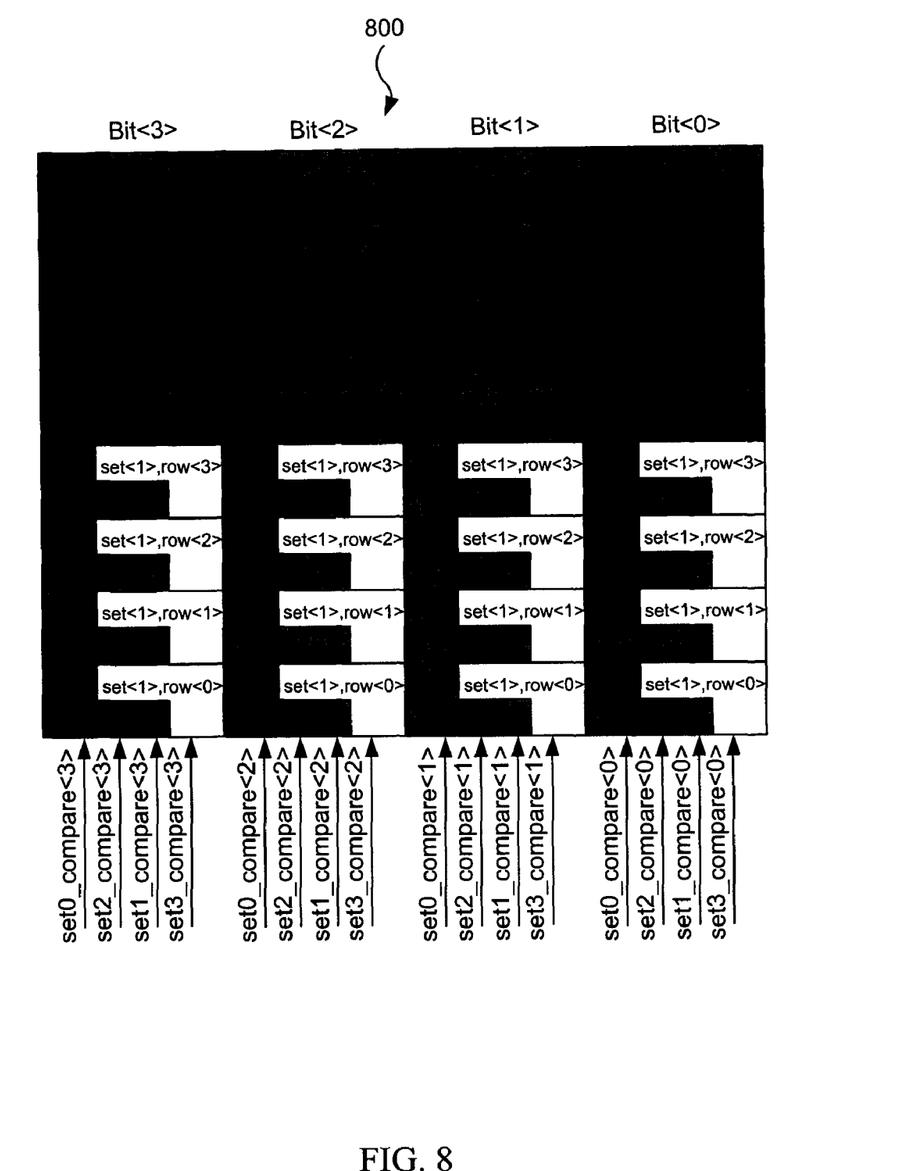
FIG. 8 is an illustration of a block diagram illustrating an interleaved 4-way set associative CAM array bank.

FIG. 7A is an illustration of a block diagram of an interleaved CAM array 701. The CAM array 701 has CAM cells 710, 720, 730, and 740, each including a compare circuit and a storage circuit (e.g., a SRAM cell). Each CAM array cell is arranged to provide an L-shaped cell which is greater in the y dimension than a conventional RAM cell. In order to reduce the area used by the design, each adjacent CAM array cell is rotated 180° relative to that CAM cell's neighboring CAM cell. With reference to FIG. 7A, the CAM cell 720 is rotated 180° relative to the CAM cell 710, and arranged in an interlocking 'L' configuration. CAM array cell 740 is likewise rotated 180° relative to the CAM array cell 730 in an interlocking 'L' configuration, thereby providing a compact design in which each unit of adjacent CAM cells (e.g., 710 and 720, 730 and 740, etc.) forms a rectangular shape having a height that is equal to approximately twice the height of the storage cell (e.g., a SRAM cell). The interlocking configuration of the L-shaped CAM cells (e.g., 710 and 720) can be considered a CAM cell unit 705 and CAM cell units can be stacked to form a CAM array such as illustrated in FIG. 8.

Figure 7B:
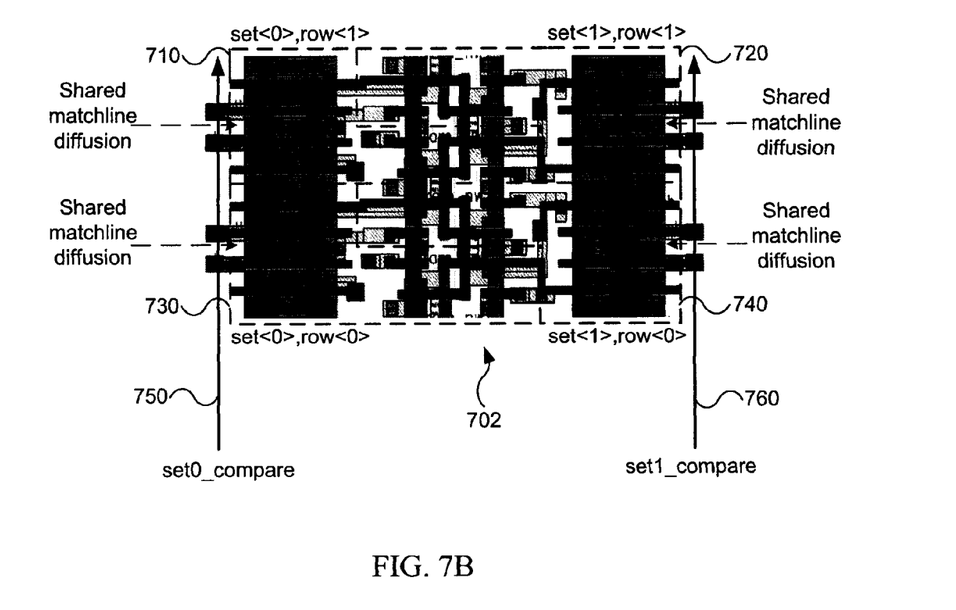
FIG. 7B is a layout of a set <0>, set<1> interleaved CAM structure.

FIG. 7B is a circuit layout of an interleaved CAM structure 702. The interleaved sets, according to embodiments of the invention, produce CAM cells with vertically aligned set compare signals, reduce the parasitic capacitance, and lower power consumption of the design. By interleaving sets, the set specific compare signals (e.g., set0_compare 750 and set1_compare 760) are vertically aligned. Further, since one line is used per compare component (e.g., compare_true), the routing used for the compare lines is reduced. The two L-shaped cells share a matchline diffusion region as discussed above in relation to FIGS. 5A and 5B. The resulting physical area of the array and capacitance in the design is reduced. Accordingly, embodiments of the invention, such as illustrated in FIGS. 7A and 7B, reduce both matchline and compare line parasitic capacitance.

Another embodiment will be described with reference to FIG. 8. FIG. 8 is an interleaved 4-way set associative CAM array bank 800. In FIG. 8, there are four rows in each set (4-way) and each row is four bits wide (e.g., four columns). Adjacent set pairs are interleaved (set 0/set 1, set 2/set 3). Each CAM cell has an associated set and row and as previously discussed, each CAM cell unit has two CAM cells. Accordingly the CAM array 800 can be formed from a plurality of CAM cell units arranged to correspond to a desired number of bits, sets, and rows. In the interleaved design, according to embodiments of the invention, each CAM cell unit has the same row numbers but has sequential set numbers. For example, a CAM cell unit can have a first CAM cell with set <0>, row<0> and a second CAM cell with set <1>, row <0>. When arranged as illustrated in FIG. 8, a unique compare signal can be provided for each bit of each set. Further, the rows in a given bit and set (e.g., bit 0, set 0, rows 1-4) receive the same bit level compare signals. Thus, the compare inputs of each row within a set are vertically aligned and coupled with one routing track per bit.

Other embodiments are directed to interleaved sets that are non-adjacent sets. It is noted that any two sets can be interleaved. In another embodiment, two physically adjacent sets, which are not logically adjacent, are interleaved. However, embodiments of the invention are not limited to 4-way set associative CAM arrays. Other embodiments can be applied to other associative memory, such as 2-way, 16-way, etc. associative memories. Embodiments of the invention can take advantage of the physical layout of the CAM cells to reduce the capacitance and improve the performance in such associative memory arrays.

As discussed in the foregoing, an interleaved set scheme can be applied to a CAM array to provide a compact physical arrangement with an overall correspondence of CAM and RAM row heights (e.g., per two cells), while reducing or minimizing routing and parasitic capacitance. Net capacitance is reduced through diffusion sharing while maintaining regular minimal (or reduced) signal routing. Accordingly, embodiments of the invention reduce area, power consumption, and allow increased operating speed of a CAM design. Also, at least one embodiment is implemented with a direct mapped decoder.

Figure 9:
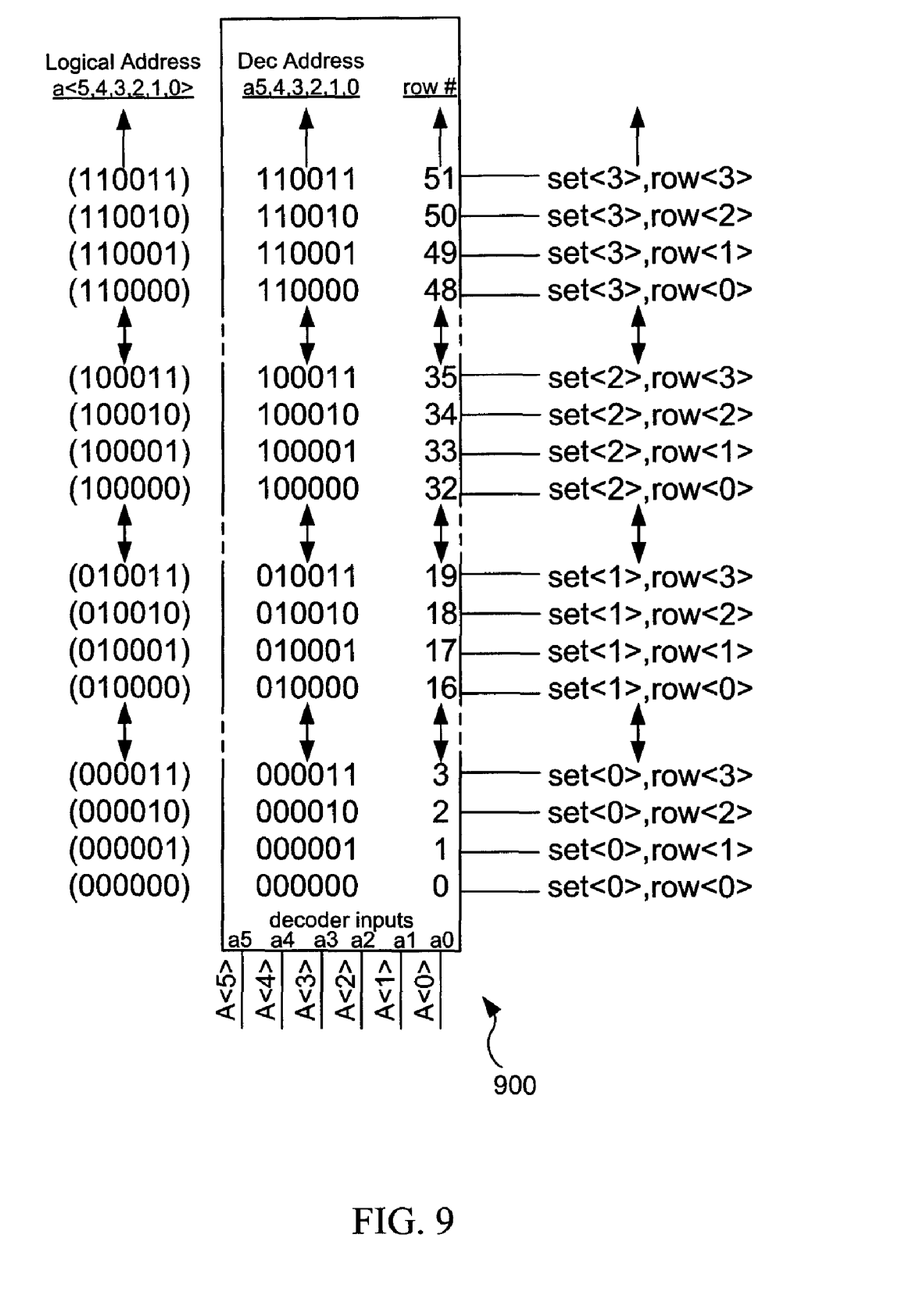
FIG. 9 is an illustration of a diagram illustrating a direct mapped decoder.

FIG. 9 is an illustration of a direct mapped decoder 900. The direct mapped decoder 900 takes a 6-bit address and decodes to 64 outputs. Each output is coupled to one of 64 rows in a memory array or cache. For example, if logical address bits A<5:0> are coupled to decoder inputs a5-a0 as shown, the mapping correlates to a physical placement where sets and rows are placed sequentially. The cache has four sets which are mapped by logical address bits A<5> and A<4>. Each of the four sets has sixteen rows (i.e., rows 0-15, 16-31, 32-47, and 48-63) mapped by logical address bits A<3:0>. The direct mapped decoder 900 is designed for sequential row addresses. However, applying the direct mapping of the decoder 900 to the interleaved CAM array would result in complex routing of the decoder outputs.

Figure 10:
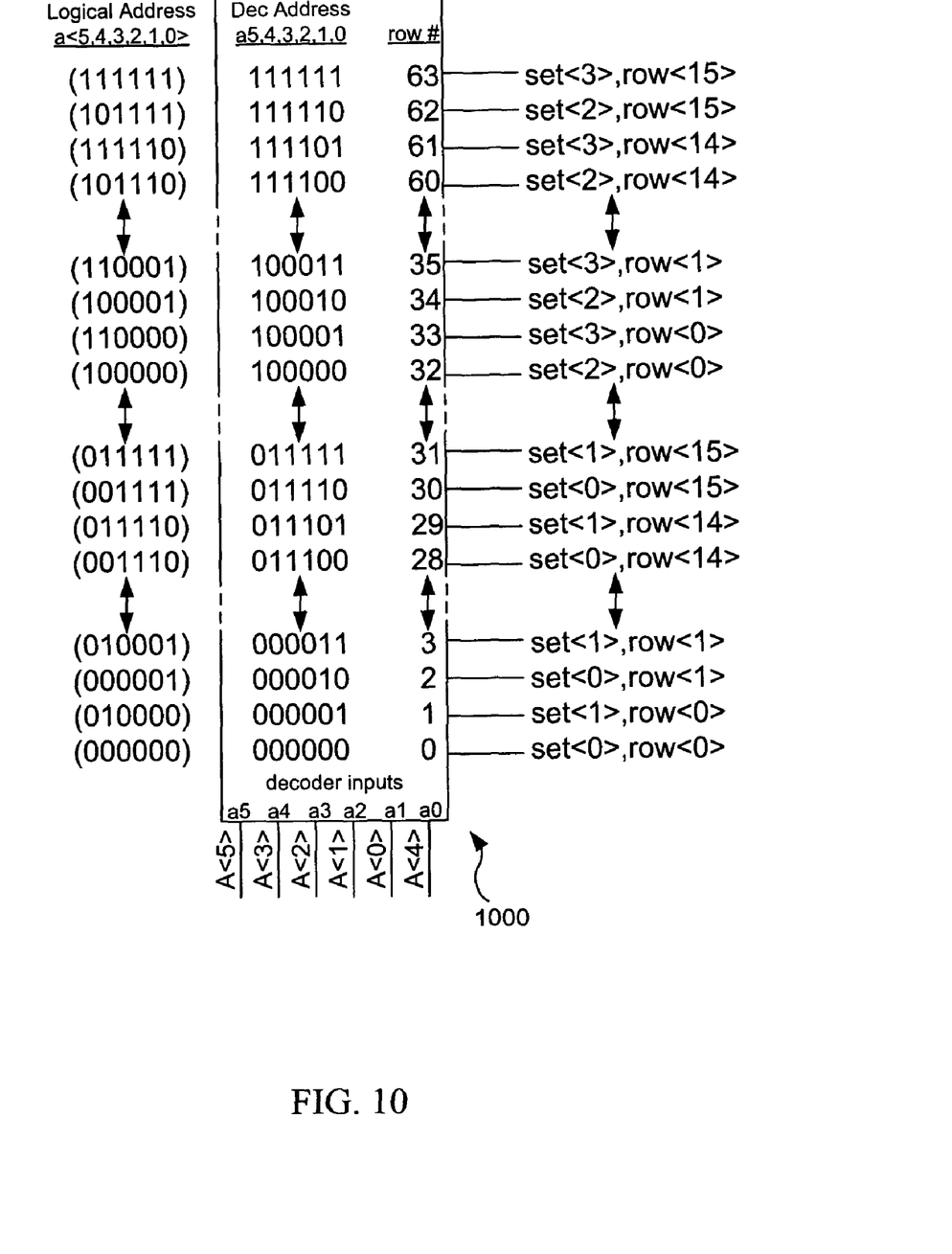
FIG. 10 is an illustration of a diagram illustrating a direct mapped decoder for an interleaved set cache.

FIG. 10 is an illustration of a block diagram of a direct mapped decoder 1000 that can be used with an interleaved set CAM array in accordance with at least one embodiment of the invention. For example, the logical address bits A<5:0> can be reordered to correspond to the interleaved set CAM array. The logical address bits A<5:0> can be reordered and connected to decoder inputs a5-a0, as illustrated in FIG. 10. The mapping correlates to a physical placement where sets and rows are placed sequentially based on the interleaved set scheme. The cache has four sets which are mapped by logical address bits A<5> and A<4>. Each of the four sets has sixteen rows (i.e., rows 0-15, 16-31, 32-47, and 48-63) mapped by logical address bits A<3:0>. Logical address bit A<4> coupled to input a0. Logical address bits A<3:0> are each shifted left by one position to correspond to inputs a4-a1, respectively. Logical address bit A<5> is coupled to input a5. For example, if logical address bits A<5:0> are coupled to decoder inputs a5-a0 as shown, the mapping correlates to a physical placement having alternating sets, where rows stay the same for each group (e.g., cell unit) of alternating sets (e.g., set<0>,row<0>; set<1>,row<0>; set<0>,row<1>; set<1>,row<1>; etc.). Therefore, the interleaved decoder 1000 of FIG. 10 can directly map to an interleaved set CAM array and does not result in complex routing of the decoder 1000 outputs. Thus, an exemplary embodiment interleaves the rows of adjacent sets and changes the order of the address bus connections to the decoder 1000 in order to provide the correct mapping to the CAM array rows.

In other embodiments, a processor includes a CAM array according to the embodiments described above. As used herein, a processor can include one or more processing circuits, for example, microprocessors, digital signal processors (DSPs), microcontrollers, Application Specific Integrated Circuits (ASICS) and combinations thereof. Accordingly, an embodiment can include a processor comprising a CAM array having a plurality of CAM cell units in which each CAM cell unit includes a first CAM cell having a first storage circuit and a first compare circuit, and a second CAM cell having a second storage circuit and a second compare circuit. Each CAM cell can be configured in an L-shape such that the first and second CAM cells are arranged in an interlocking configuration to form a substantially rectangular shape, thereby minimizing physical area of the array and/or the capacitance in the design. Accordingly, the embodiments described above can reduce both matchline and compare line parasitic capacitance in CAM array integrated within a processor.

Another embodiment is directed to a method of forming a CAM array, or a processor including a CAM array having a plurality of CAM cells (e.g., first and second CAM cells) according to the embodiments described above, arranged to reduce the area used, routing complexity, and parasitic capacitance.

For example, an embodiment is directed to a method having the steps of forming an L-shaped first CAM cell having a first storage circuit and a first compare circuit, and forming an L-shaped second CAM cell having a second storage circuit and a second compare circuit. The method includes arranging the first and second CAM cells in an interlocking configuration to form a substantially rectangular shape, in which the first and second storage circuits are vertically stacked, and the first and second compare circuits are each positioned at respective outer edges of the rectangle. The method further includes associating each CAM cell with a set and row.

For example, in one embodiment, the first CAM cell is associated with a first row of a first set and the second CAM cell is associated with a second row of the first set. The embodiment includes configuring a decoder to have sequential outputs mapped to the first row of the first set and to the second row of the first set.

In another embodiment, the first CAM cell is associated with a first row of a first set and the second CAM cell is associated with a first row of a second set. The embodiment includes configuring a decoder to have sequential outputs mapped to the first row of the first set and to the first row of the second set. Accordingly, the exemplary methods can provide a CAM array, or processor having a CAM array, in which the physical area of the array and/or the capacitance can be reduced. The embodiments described above can reduce both matchline and compare line parasitic capacitance.

It should be appreciated that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, it should be appreciated that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of embodiments of the present invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Content Addressable Memory (CAM) comprising:
   a first CAM cell having a first storage circuit and a first compare circuit, and a second CAM cell having a second storage circuit and a second compare circuit,
   wherein the first CAM cell and the second CAM cell are positioned into a substantially rectangular area,
   wherein the first and second storage circuits are vertically stacked and adjacent to each other, and
   wherein the first and second compare circuits are separated by the first and second storage circuits, and each positioned at respective outer edges of the substantially rectangular area.

2. The Content Addressable Memory according to claim 1, wherein rows of the first and second compare circuits are arranged sequentially.

3. The Content Addressable Memory according to claim 1, wherein the first CAM cell is associated with a first row of a first set and the second CAM cell is associated with a second row of the first set.

4. The Content Addressable Memory according to claim 1, wherein adjacent sets of the first and second compare circuits are arranged sequentially.

5. The Content Addressable Memory according to claim 1, wherein the first CAM cell is associated with a first row of a first set and the second CAM cell is associated with a first row of a second set.

6. The Content Addressable Memory according to claim 1, further comprising:
a plurality of first and second CAM cells as recited in claim 1, wherein each CAM cell has an associated set and row and wherein compare inputs of each row within a set are vertically aligned.

7. The Content Addressable Memory according to claim 6, wherein each compare input of each row within one set is connected with one routing track.

8. The Content Addressable Memory according to claim 1, wherein a height of the first compare circuit is greater than a height of the first storage circuit.

9. The Content Addressable Memory according to claim 1, wherein a height of the rectangular area is approximately equal to a height of the vertically stacked storage circuits.

10. The Content Addressable Memory according to claim 1, wherein the first and second storage circuits are positioned at a center portion within the rectangular area.

11. A processor having a Content Addressable Memory (CAM) array, comprising:
a plurality of CAM cell units, each CAM cell unit including:
a first CAM cell having a first storage circuit and a first compare circuit; and
a second CAM cell having a second storage circuit and a second compare circuit, each CAM cell is configured in an L-shape, and wherein the first and second CAM cells are arranged in an interlocking configuration to form a substantially rectangular shape, and wherein the first and second storage circuits are adjacent to each other and the first and second compare circuits are separated by the first and second storage circuits, and each compare circuit positioned at respective outer edges of the substantially rectangular area.

12. The processor according to claim 11, wherein each CAM cell has an associated set and row.

13. The processor according to claim 12, wherein rows of the first and second compare circuits are arranged sequentially.

14. The processor according to claim 12, wherein the first CAM cell is associated with a first row of a first set and the second CAM cell is associated with a second row of the first set.

15. The processor according to claim 14, further comprising:
a decoder configured to directly map to rows of the first and second CAM cells.

16. The processor according to claim 15, wherein the decoder is configured to have sequential outputs mapped to the first row of the first set and to the second row of the first set.

17. The processor according to claim 12, wherein adjacent sets of the first and second compare circuits are arranged sequentially.

18. The processor according to claim 12, wherein the first CAM cell is associated with a first row of a first set and the second CAM cell is associated with a first row of a second set.

19. The processor according to claim 18, further comprising:
a decoder configured to directly map to rows of the first and second CAM cells.

20. The processor according to claim 19, wherein the decoder is configured to have sequential outputs mapped to the first row of the first set and to the first row of the second set.

21. The processor according to claim 11, wherein at least two CAM cell units are stacked vertically and wherein inputs of each row within a set are vertically aligned.

22. The processor according to claim 11, comprising:
a first CAM cell unit and a second CAM cell unit from the plurality of CAM cell units arranged vertically, wherein the first and second CAM cells of the first and second CAM cell units are in vertical alignment.

23. A method for producing a Content Addressable Memory (CAM), the method comprising:
forming an L-shaped first CAM cell having a first storage circuit and a first compare circuit;
forming an L-shaped second CAM cell having a second storage circuit and a second compare circuit;
arranging the first and second CAM cells in an interlocking configuration to form a substantially rectangular shape;
stacking the first and second storage circuits vertically and adjacent to each other ; and
positioning the first and second compare circuits at respective outer edges of the substantially rectangular shape, such that they are separated by the first and second storage circuits.

24. The method according to claim 23, further comprising:
associating each CAM cell with a set and row.

25. The method according to claim 24, wherein the first CAM cell is associated with a first row of a first set and the second CAM cell is associated with a second row of the first set.

26. The method according to claim 25, further comprising:
configuring a decoder to directly map to rows of the first and second CAM cells, wherein the decoder is configured to have sequential outputs mapped to the first row of the first set and to the second row of the first set.

27. The method according to claim 24, wherein the first CAM cell is associated with a first row of a first set and the second CAM cell is associated with a first row of a second set.

28. The method according to claim 27, further comprising:
configuring a decoder to have sequential outputs mapped to the first row of the first set and to the first row of the second set.

29. A Content Addressable Memory (CAM) system comprising:
means for forming an L-shaped first CAM cell having a first storage circuit and a first compare circuit;
means for forming an L-shaped second CAM cell having a second storage circuit and a second compare circuit;
means for arranging the first and second CAM cells in an interlocking configuration to form a substantially rectangular shape;
means for stacking the first and second storage circuits vertically and adjacent to each other; and
means for positioning the first and second compare circuits at respective outer edges of the substantially rectangular shape, such that they are separated by the first and second storage circuits.

30. The CAM system according to claim 29, further comprising:
means for associating each CAM cell with a set and row.

31. The CAM system according to claim 30, wherein the first CAM cell is associated with a first row of a first set and the second CAM cell is associated with a second row of the first set.

32. The CAM system according to claim 31, further comprising:
   means for configuring a decoder to directly map to rows of the first and second CAM cells, wherein the decoder is configured to have sequential outputs mapped to the first row of the first set and to the second row of the first set.

33. The CAM system according to claim 30, wherein the first CAM cell is associated with a first row of a first set and the second CAM cell is associated with a first row of a second set.

34. The CAM system according to claim 33, further comprising:
   means for configuring a decoder to have sequential outputs mapped to the first row of the first set and to the first row of the second set.

* * * * *